US012604408B2

(12) United States Patent (10) Patent No.: US 12,604,408 B2
Chueh et al. (45) Date of Patent: Apr. 14, 2026

(54) CIRCUIT BOARD MODULE AND ELECTRONIC DEVICE WITH THE SAME

(71) Applicant: DELTA ELECTRONICS, INC., Taoyuan City (TW)

(72) Inventors: Hung-Wen Chueh, Taoyuan City (TW); Chia-Yu Chen, Taoyuan City (TW); Yan-Ru Chen, Taoyuan City (TW)

(73) Assignee: DELTA ELECTRONICS, INC., Taoyuan City (TW)

( * ) Notice: Subject to any disclaimer, the term of this patent is extended or adjusted under 35 U.S.C. 154(b) by 210 days.

(21) Appl. No.: 18/531,712

(22) Filed: Dec. 7, 2023

(65) Prior Publication Data

US 2025/0048555 A1 Feb. 6, 2025

(30) Foreign Application Priority Data

Jul. 31, 2023 (CN) .......................... 202310949907.1

(51) Int. Cl.
H05K 1/18 (2026.01)
(52) U.S. Cl.
CPC ......... H05K 1/18 (2013.01); *H05K 2201/048* (2013.01); *H05K 2201/10015* (2013.01); *H05K 2201/10545* (2013.01)
(58) Field of Classification Search
CPC .......... H05K 2201/10015; H05K 2201/10545
USPC ......................................................... 361/760
See application file for complete search history.

(56) References Cited

U.S. PATENT DOCUMENTS

| | | | |
|---|---|---|---|
| 8,564,966 B2 | 10/2013 | Kitagawa et al. | |
| 2009/0174031 A1* | 7/2009 | Wang ..................... | H10D 1/047 |
| | | | 257/532 |
| 2010/0100164 A1* | 4/2010 | Johnson ................ | H01F 27/027 |
| | | | 607/116 |
| 2014/0252547 A1* | 9/2014 | Chen ..................... | H10D 86/00 |
| | | | 257/532 |
| 2015/0364253 A1 | 12/2015 | Arnold et al. | |
| 2016/0356825 A1* | 12/2016 | Bae ..................... | H03F 3/45475 |
| 2022/0246653 A1* | 8/2022 | Tonegawa .............. | H10D 1/716 |

FOREIGN PATENT DOCUMENTS

| | | |
|---|---|---|
| CN | 100440393 C | 12/2008 |
| CN | 111295037 A | 6/2020 |
| CN | 111295038 A | 6/2020 |
| CN | 214959150 U | 11/2021 |
| JP | H09-64508 A | 3/1997 |
| JP | H10275512 A | 10/1998 |
| JP | 2000-277883 A | 10/2000 |
| JP | 2009-218285 A | 9/2009 |
| JP | 2011-222826 A | 11/2011 |
| JP | 2016-134620 A | 7/2016 |

(Continued)

*Primary Examiner* — Andargie M Aychillhum

(74) *Attorney, Agent, or Firm* — CKC & Partners Co., LLC

(57) ABSTRACT

A circuit board module includes a circuit board and a plurality of capacitors. The circuit board has a plurality of standing feet for erecting on a main board, and the capacitors are symmetrically fixed on a first surface and a second surface opposite to the first surface of the circuit board. An opening is formed on the circuit board of the circuit board module and the opening is located between the capacitors. In addition, an electronic device adopting the circuit board module design is also disclosed herein.

20 Claims, 7 Drawing Sheets

(56)　　　　　　　References Cited

FOREIGN PATENT DOCUMENTS

| JP | 2023-000037 | A | 1/2023 |
| TW | 498373 | B | 8/2002 |
| TW | I310171 | B | 5/2009 |
| TW | I543678 | B | 7/2016 |
| WO | 2005029674 | A1 | 3/2005 |

* cited by examiner

CIRCUIT BOARD MODULE AND ELECTRONIC DEVICE WITH THE SAME

RELATED APPLICATIONS

This application claims priority to Chinese Application Serial Number 202310949907.1, filed Jul. 31, 2023, the disclosures of which are incorporated herein by reference in their entireties.

TECHNICAL FIELD

The present disclosure relates to a circuit board module and an electronic device with the circuit board module. More particularly, the present disclosure relates to an anti-noise circuit board module and an electronic device with the anti-noise circuit board module.

BACKGROUND

With the progress of the society, various types of electronic devices have become more diversified. In the electronic devices, capacitors such as ceramic capacitors, tantalum electrolytic capacitors, aluminum electrolytic capacitors, and film capacitors are popularly used. In addition, most ceramic capacitors are constructed of laminated ceramic capacitors having a structure in which a plurality of electrode pairs is laminated.

The ceramic capacitors can be manufactured in a small size because of their dielectrics having high permittivity and are widely used in modern electronic apparatuses because of their capacitances exhibiting small changes with aging. The ceramic materials used in ceramic capacitors exhibit electrostrictive properties such that the ceramic materials are mechanically deformed when an electric voltage is applied to both ends of the capacitor.

In addition, when an adapter product is designed, hybrid flyback circuits are often used as well as multilayer ceramic capacitors (MLCCs) are used in the resonant capacitors of the hybrid flyback circuits. Due to the circuit characteristics, an alternating voltage will be generated at both ends of the multilayer ceramic capacitor and may cause a piezoelectric effect on the multilayer ceramic capacitor, thereby causing the body of the multilayer ceramic capacitor to vibrate and then occurring resonance between the pads at both ends of the multilayer ceramic capacitor and the circuit board so as to generate noise.

There is a need to provide a circuit design able to reduce the noise of capacitor modules so as to effectively improve the quality and service life of the electronic products.

SUMMARY

The summary of the present invention is intended to provide a simplified description of the disclosure to enable readers to have a basic understanding of the disclosure. The summary of the present invention is not a complete overview of the disclosure, and it is not intended to point out the importance of the embodiments/key elements of the present invention or define the scope of the invention.

One objective of the embodiments of the present invention is to provide a circuit board module able to reduce the noise and improve the quality and service life of the electronic devices.

To achieve these and other advantages and in accordance with the objective of the embodiments of the present invention, as the embodiment broadly describes herein, the embodiments of the present invention provides a circuit board module including a circuit board and a plurality of capacitors. The circuit board includes a plurality of standing feet to erect on a main board and the capacitors are symmetrically fixed on a first surface and a second surface opposite to the first surface of the circuit board.

In some embodiments, an opening is formed on the circuit board and located between the capacitors.

In some embodiments, the capacitors include a plurality of first capacitors arranged in sequence on the first surface of the circuit board from one end close to the standing feet of the circuit board to another end of the circuit board.

In some embodiments, the capacitors include a plurality of second capacitors arranged in sequence on the second surface of the circuit board from one end close to the standing feet of the circuit board to another end of the circuit board.

In some embodiments, capacitance values of the first capacitors are the same as capacitance values of the second capacitors.

In some embodiments, capacitance values of the first capacitors are different and capacitance values of the second capacitors are different.

In some embodiments, the capacitance values of the first capacitors and the capacitance values of the second capacitors are symmetrically arranged in sequence from the end close to the standing feet of the circuit board to the another end of the circuit board.

In some embodiments, capacitance values of capacitors, close to the standing feet, of the first capacitors and the second capacitors are greater than capacitance values of capacitors, far away from the standing feet, of the first capacitors and the second capacitors.

In some embodiments, capacitance values of capacitors of the first capacitors and the second capacitors gradually decrease in sequence from the end close to the standing feet to the another end far away from the standing feet.

In some embodiments, two indentation portions are formed correspondingly on two side surfaces of the circuit board.

In accordance with another aspect of the present invention, an electronic device is provided. The electronic device includes a casing, a main board installed in the casing, a circuit board and a plurality of capacitors. The main board is installed in the casing, the circuit board is installed in the casing, and the circuit board includes a plurality of standing feet to erect on the main board. In addition, the capacitors are symmetrically fixed on a first surface and a second surface opposite to the first surface of the circuit board, and the circuit board includes an opening located between the capacitors, the capacitors include a plurality of first capacitors arranged in sequence on the first surface of the circuit board from one end close to the standing feet of the circuit board to another end of the circuit board and the capacitors further include a plurality of second capacitors arranged in sequence on the second surface of the circuit board from the one end close to the standing feet of the circuit board to the another end of the circuit board.

In some embodiments, capacitance values of the first capacitors are the same as capacitance values of the second capacitors.

In some embodiments, capacitance values of the first capacitors are different and capacitance values of the second capacitors are different.

In some embodiments, the capacitance values of the first capacitors and the capacitance values of the second capacitors are symmetrically arranged in sequence from the end close to the standing feet of the circuit board to the another end of the circuit board.

In some embodiments, capacitance values of capacitors, close to the standing feet, of the first capacitors and the second capacitors are greater than capacitance values of capacitors, far away from the standing feet, of the first capacitors and the second capacitors.

In some embodiments, capacitance values of capacitors of the first capacitors and the second capacitors gradually decrease in sequence from the end close to the standing feet to the another end far away from the standing feet.

In some embodiments, two indentation portions are formed correspondingly on two side surfaces of the circuit board.

In accordance with another aspect of the present invention, an electronic device is provided. The electronic device includes a main board, a circuit board, a plurality of first capacitors and a plurality of second capacitors. The circuit board includes a plurality of standing feet to erect on the main board, and the first capacitors and the second capacitors are symmetrically fixed on a first surface and a second surface opposite to the first surface of the circuit board. In addition, the circuit board includes an opening located between the first capacitors and the second capacitors.

In some embodiments, capacitance values of the first capacitors are the same as capacitance values of the second capacitors.

In some embodiments, the first capacitors and the second capacitors are symmetrically arranged in order according to capacitance values of the first capacitors and the second capacitors.

Hence, the circuit board module and electronic device disclosed in the present disclosure may effectively use symmetrically arranged capacitors to attenuate vibrations therefore during operation, and may also use the opening formed in the middle of the circuit board greatly reduces the contact area between the capacitors and the circuit board, and may use air to isolate the noise transmission so as to reduce the noise conducted by solid objects such as the circuit board. In addition, the working efficiency and quality of the circuit board module may further be improved while the larger capacitors are located close to the standing feet and the smaller capacitors are located far away from the standing feet.

BRIEF DESCRIPTION OF THE DRAWINGS

The disclosure can be more fully understood by reading the following detailed description of the embodiment, with reference made to the accompanying drawings as follows.

DETAILED DESCRIPTION OF THE PREFERRED EMBODIMENT

Figure 1:
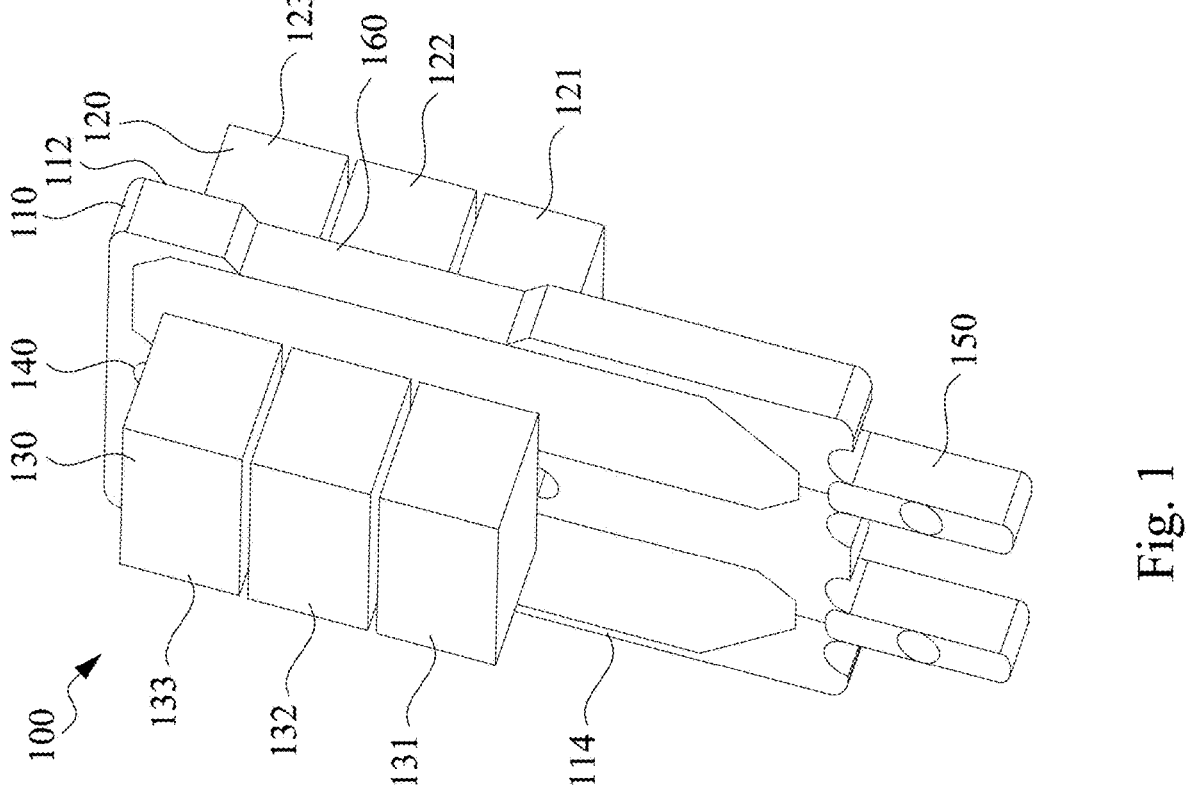
FIG. 1 illustrates a schematic perspective diagram showing a circuit board module according to one embodiment of the present invention.

The following is a detailed description of the embodiments in conjunction with the accompanying drawings, but the provided embodiments are not intended to limit the scope of the disclosure, and the description of the structure and operation is not used to limit the execution sequence thereof. The structure of the recombination of components and the resulting devices with equal functions are all within the scope of this disclosure. In addition, the drawings are for illustration purposes only, and are not drawn according to the original scale. For ease of understanding, the same reference numbers are used in the drawings and the description to refer to the same or like parts.

In addition, the terms used in the entire description and the scope of the patent application, unless otherwise specified, usually have the usual meaning of each term used in this field, in the content disclosed here and in the special content. Some terms used to describe the disclosure are discussed below or elsewhere in this specification to provide additional guidance to those skilled in the art in the disclosure.

In the implementation mode and the scope of the present application, unless the article is specifically limited in the context, "a" and "the" can generally refer to a single or pluralities. In the steps, the numbering is only used to conveniently describe the steps, rather than to limit the sequence and implementation.

Secondly, the words "comprising", "including", "having", "containing" and the like used in the present application are all open language, meaning including but not limited to.

Figure 2:
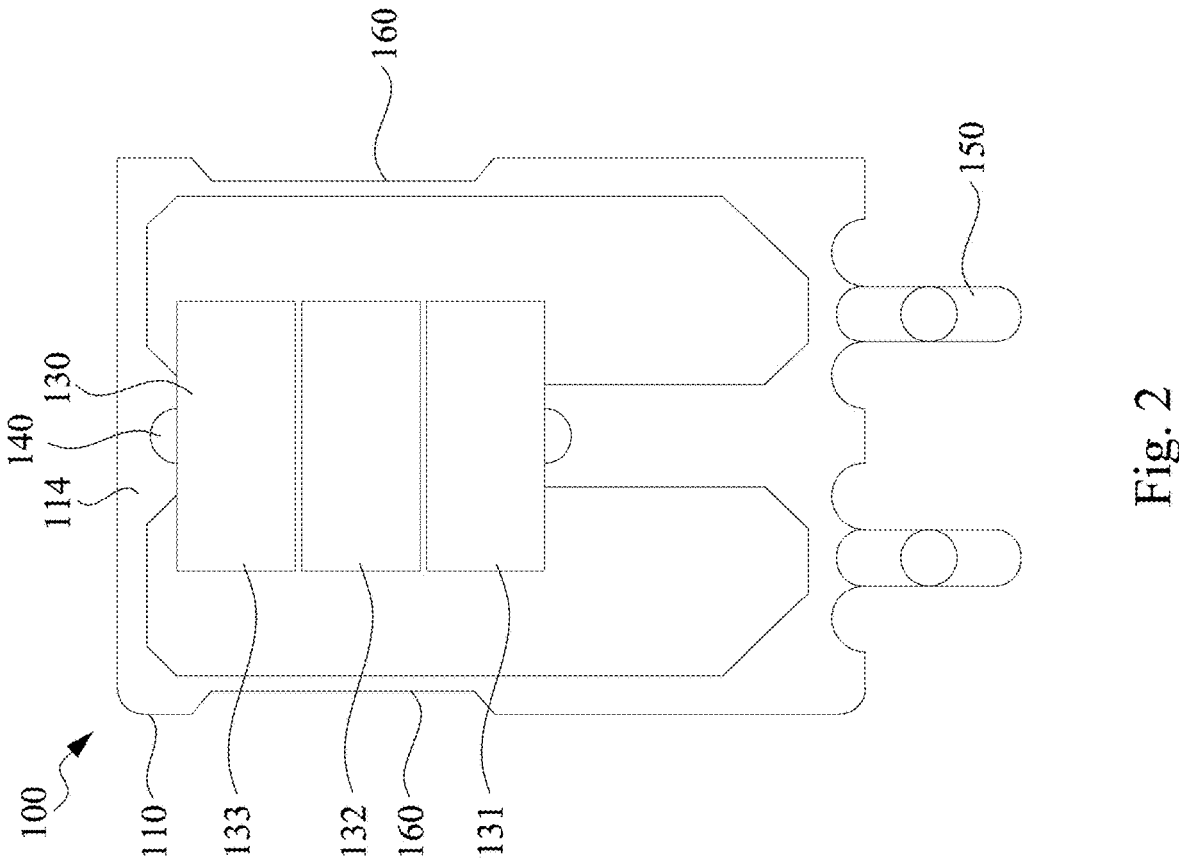
FIG. 2 illustrates a schematic front elevational view showing the circuit board module of FIG. 1.
Figure 3:
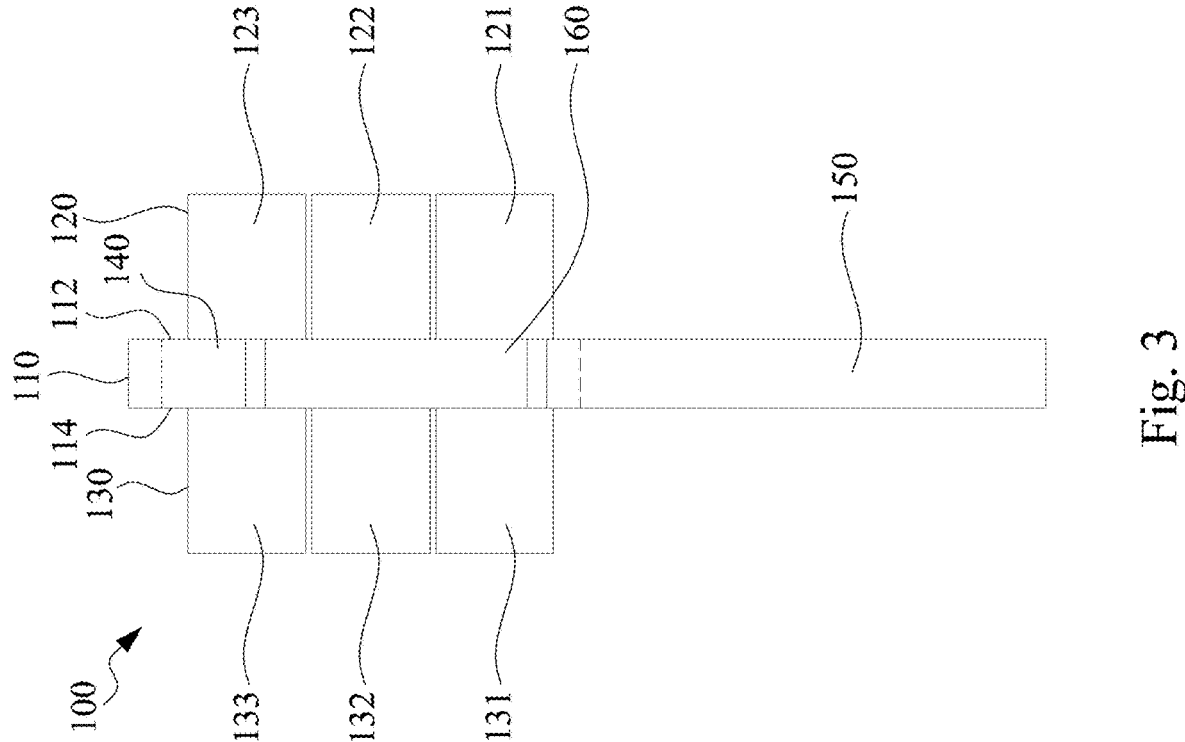
FIG. 3 illustrates a schematic side elevational view showing the circuit board module of FIG. 1.
Figure 4:
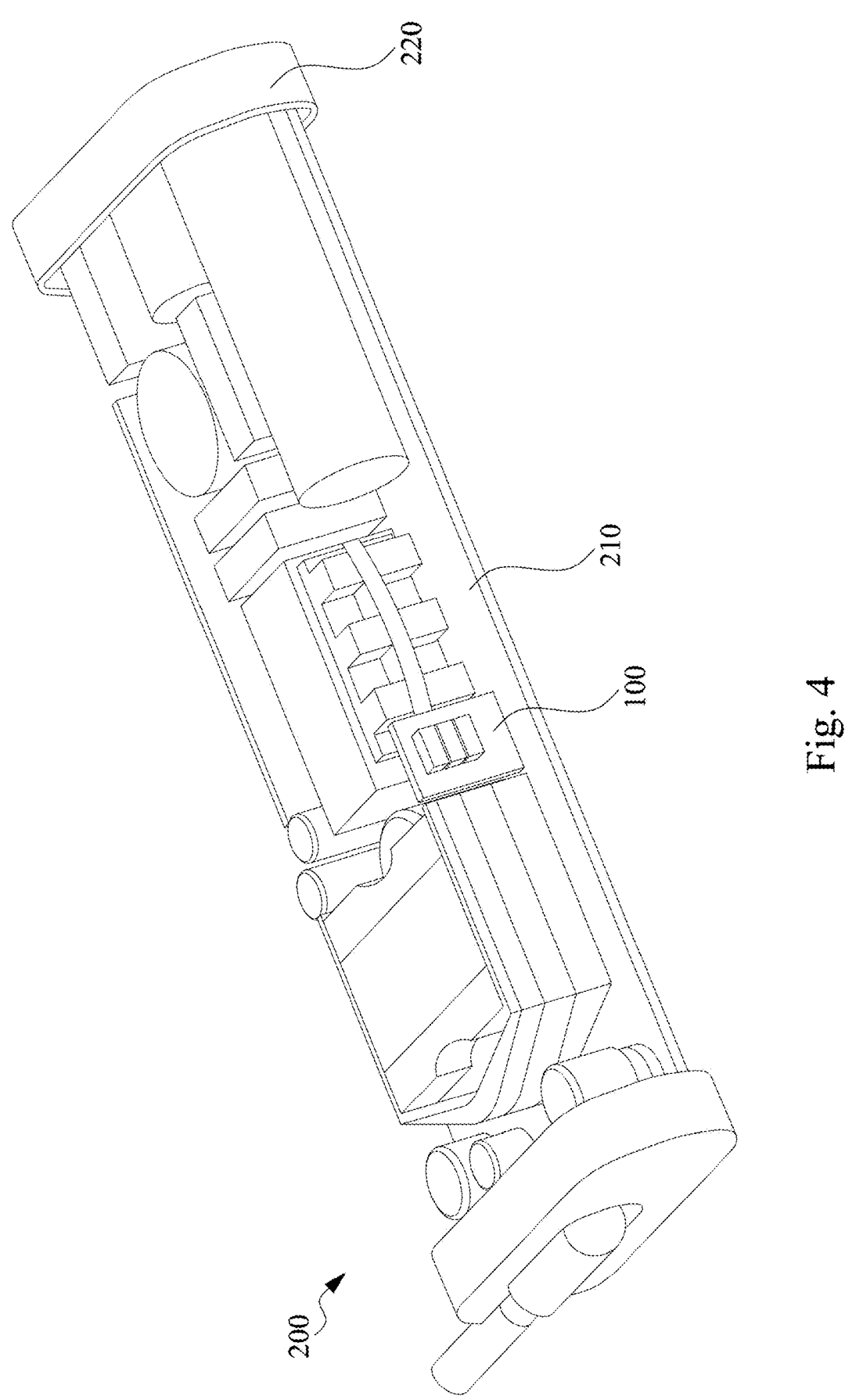
FIG. 4 illustrates a schematic diagram showing an electronic device equipped with the circuit board module according to one embodiment of the present invention.
Figure 5:
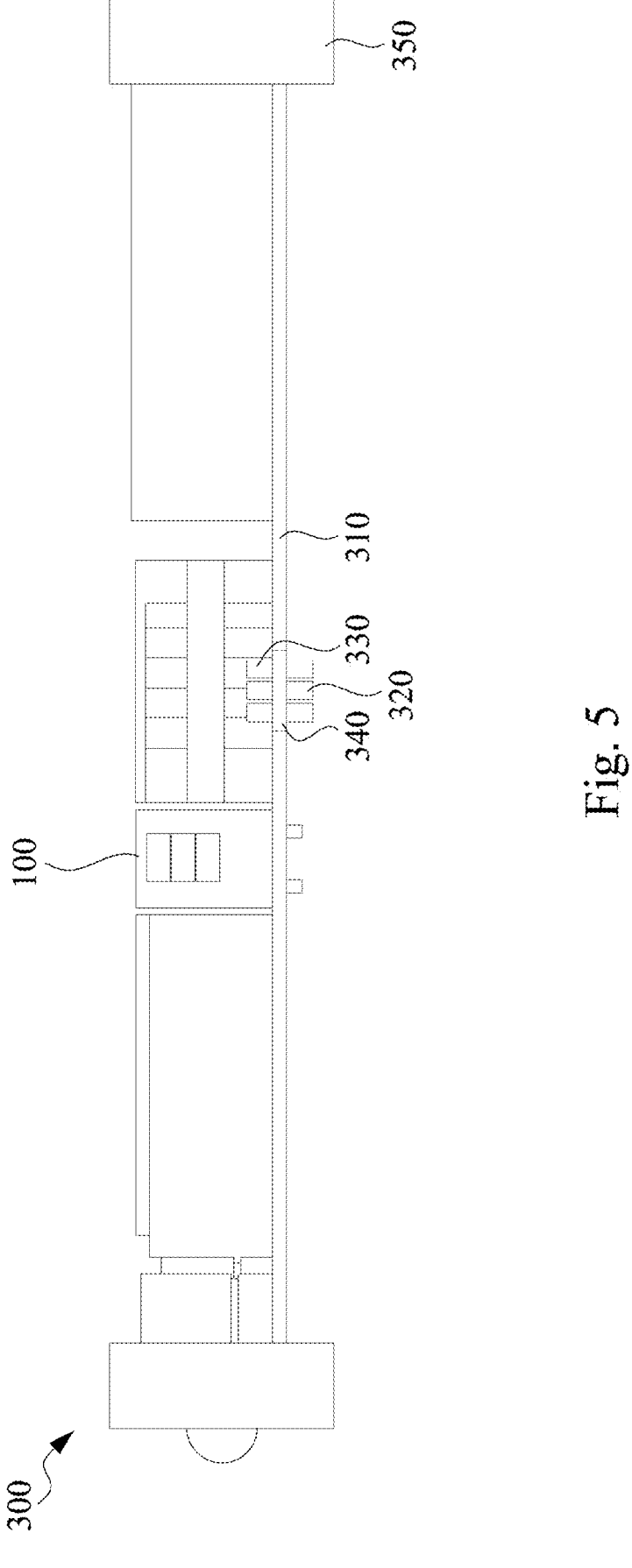
FIG. 5 illustrates a schematic diagram showing an electronic device equipped with the circuit board module according to another embodiment of the present invention.
Figure 6:
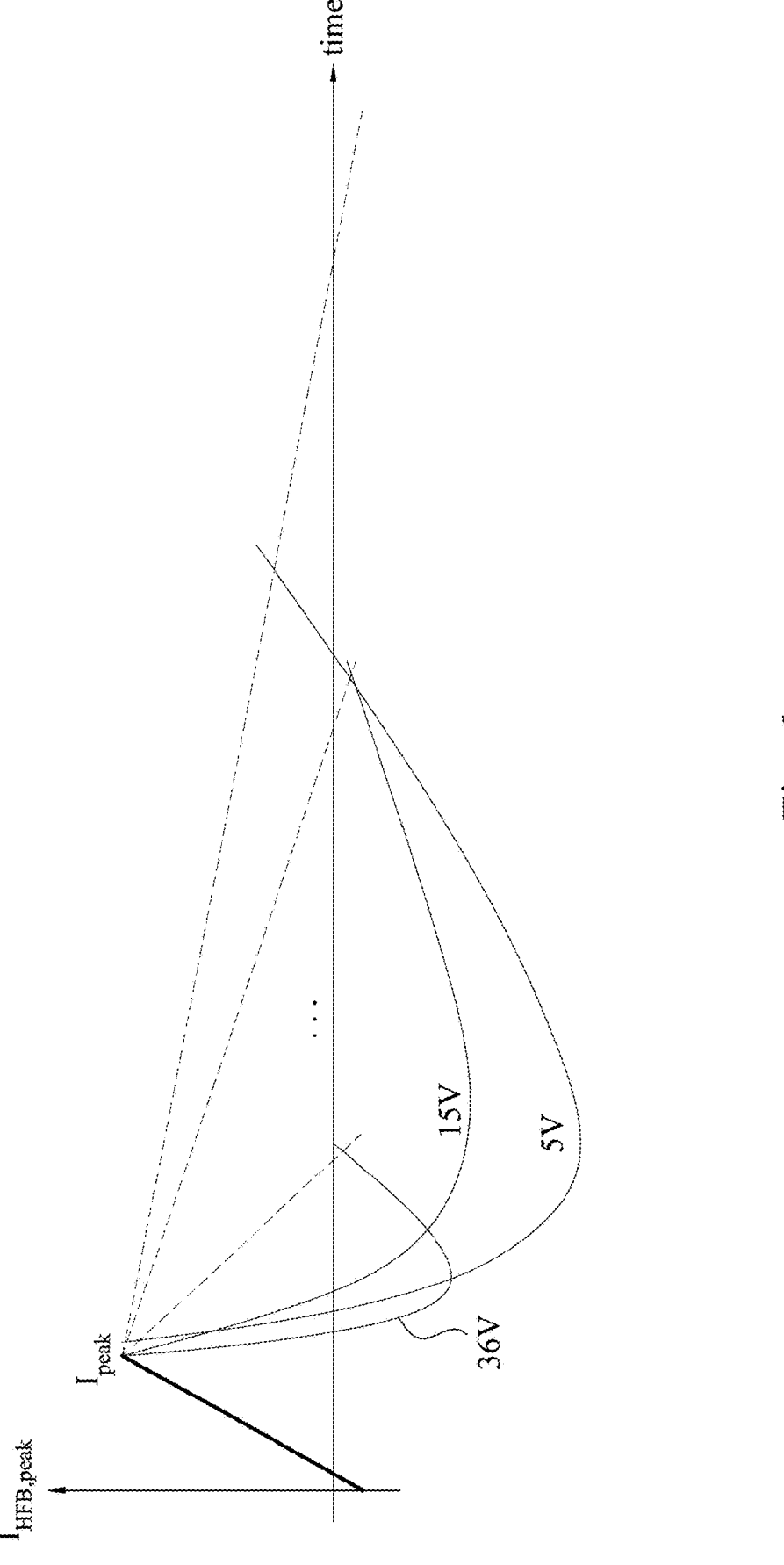
FIG. 6 is a schematic diagram of the voltage attenuation rate of multilayer ceramic capacitors.
Figure 7:
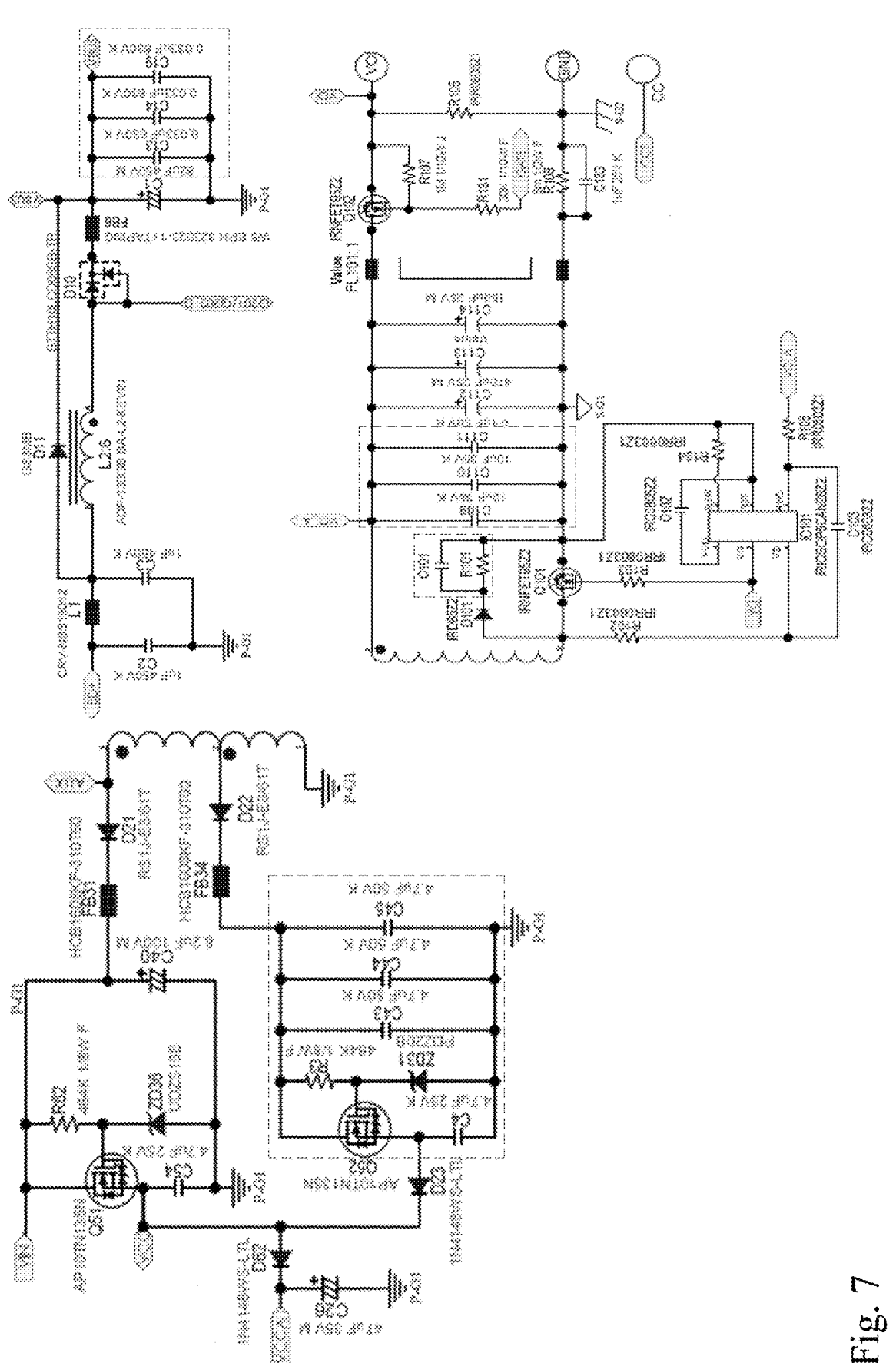
FIG. 7 is a schematic diagram of the circuit board module of the present invention applied to various circuits.

FIG. 1 illustrates a schematic perspective diagram showing a circuit board module according to one embodiment of the present invention, FIG. 2 illustrates a schematic front elevational view thereof, FIG. 3 illustrates a schematic side elevational view thereof. FIG. 4 and FIG. 5 illustrate electronic devices equipped with the circuit board module according to some embodiment of the present invention. In addition, FIG. 6 is a schematic diagram of the voltage attenuation rate of multilayer ceramic capacitors and FIG. 7 is a schematic diagram of the circuit board module of the present invention applied to various circuits.

Referring to FIG. 1, as shown in the figure, a circuit board module 100 includes a circuit board 110 and a plurality of capacitors, for example, a plurality of first capacitors 120 located on a first surface 112 and a plurality of second capacitors 130 located on a second surface 114. The first capacitors 120 and the second capacitors 130 are symmetrically located on the first surface 112 and the second surface 114 opposite to the first surface 112 of the circuit board 110. Hence, the vibration may be effectively compensated by the symmetrical arrangement of the first capacitors 120 and the second capacitors 130 during operation.

In some embodiments, the circuit board 110 includes a plurality of standing feet 150 to erect on a main board, for example, a main board 210 of FIG. 4 or a main board 310 of FIG. 5. In some embodiments, a plurality of capacitors may also be fixed on a main board, for example, a plurality of capacitors symmetrically equipped on the main board 310 as shown in FIG. 5, without departing from the spirit and scope of the disclosure.

In some embodiments, an opening 140 is formed on the circuit board 110 and located between the first capacitors

120 and the second capacitors 130. The contacting area between the circuit board 110 and the first capacitors 120 and the second capacitors 130 are effectively reduced with the opening 140 formed on the circuit board 110. In addition, the opening 140 may further isolate the noise transmission with air in the opening 140 to effectively reduce the noise conducted by solid objects such as the circuit board 110.

In some embodiments, the first surface 112 of the circuit board 110 is equipped with a plurality of first capacitors 120, for example, a first one of the first capacitors 121, a second one of the first capacitors 122 and a third one of the first capacitors 123 arranged in sequence on the first surface 112 of the circuit board 110 from one end close to the standing feet 150 of the circuit board 110 to another end of the circuit board 110.

In some embodiments, the second surface 114 of the circuit board 110 is equipped with a plurality of second capacitors 130, for example, a first one of the second capacitors 131, a second one of the second capacitors 132 and a third one of the second capacitors 133 arranged in sequence on the second surface 114 of the circuit board 110 from one end close to the standing feet 150 of the circuit board 110 to another end of the circuit board 110.

In some embodiments, the capacitance values of the first capacitors 120 are the same as the capacitance values of the second capacitors 130. That is to say, the capacitance values of the first one of the first capacitors 121, the second one of the first capacitors 122, the third one of the first capacitors 123, the first one of the second capacitors 131, the second one of the second capacitors 132 and the third one of the second capacitors 133 are all the same.

In some embodiments, the capacitance values of the first capacitors 120 are different and the capacitance values of the second capacitors 130 are also different. That is to say, the capacitance values of the first one of the first capacitors 121, the second one of the first capacitors 122, the third one of the first capacitors 123 are different, and the capacitance values of the first one of the second capacitors 131, the second one of the second capacitors 132 and the third one of the second capacitors 133 are also different.

In some embodiments, the capacitance values of the first capacitors 120 and the capacitance values of the second capacitors 130 are symmetrically arranged in sequence from one end close to the standing feet 150 of the circuit board 110 to another end far away from the standing feet 150 of the circuit board 110. That is to say, the capacitance value of the first one of the first capacitors 121 is the same as the capacitance value of the first one of the second capacitors 131, the capacitance value of the second one of the first capacitors 122 is the same as the capacitance value of the second one of the second capacitors 132. In addition, the capacitance value of the third one of the first capacitors 123 is the same as the capacitance value of the third one of the second capacitors 133.

In some embodiments, the capacitance values of the first one of the first capacitors 121 and the first one of the second capacitors 131 close to the standing feet 150 are greater than the capacitance values of the third one of the first capacitors 123 and the third one of the second capacitors 133 far away from the standing feet 150.

In some embodiments, the capacitance values of the second one of the first capacitors 122 and the second one of the second capacitors 132 are between the capacitance values of the first one of the first capacitors 121 and the first one of the second capacitors 131 and the capacitance values of the third one of the first capacitors 123 and the third one of the second capacitors 133. Therefore, the capacitance values of the first capacitors 120 and the capacitance values of the second capacitors 130 gradually decrease in order from one end close to the standing feet 150 of the circuit board 110 to another end far away from the standing feet 150 of the circuit board 110 so as to effectively increase the working efficiency and the quality of the circuit board module 100.

In some embodiments, indentation portions 160 are respectively formed on two side surfaces of the circuit board 110 so that a user may conveniently install the circuit board module 100 on the main board or remove the circuit board module 100 from the main board without departing from the spirit and scope of the disclosure.

Further referring to FIG. 4, as shown in the figure, an electronic device 200 includes a casing 220, a main board 210 and a circuit board module 100 as illustrated in FIG. 1 to FIG. 3. The circuit board module 100 is fixed on the main board 210, and the main board 210 and the circuit board module 100 are equipped in the casing 220.

In addition, referring to FIG. 5, as shown in the figure, an electronic device 300 includes a casing 350, a main board 310 and a plurality of first capacitors 320 and a plurality of second capacitors 330. The first capacitors 320 and the second capacitors 330 are respectively symmetrically fixed on opposite surfaces of the main board 310. In addition, an opening 340 is further formed on the main board 310 and located between the first capacitors 320 and the second capacitors 330.

In some embodiments, the capacitance values of the first capacitors 320 and the second capacitors 330 are all the same.

In some embodiments, the capacitance values of the first capacitors 320 are symmetrically with the capacitance values of the second capacitors 330 and arranged in order according to the capacitance value, for example, the capacitance values of the first capacitors 320 and the second capacitors 330 gradually increase or decrease from the right side to the left side of FIG. 5, without departing from the spirit and scope of the disclosure.

In some embodiments, the electronic device 300 may further include a circuit board module 100 installed on the main board 310 as illustrated in FIG. 1 to FIG. 3, without departing from the spirit and scope of the disclosure.

The conventional resonant capacitors in the resonant circuit structure usually adopt film capacitors. However, the adapter product disclosed in the present disclosure adopts a hybrid flyback circuit structure and be applied to a wide output voltage range (5V~48V), so that multilayer ceramic capacitors are adopted as resonant capacitors. In addition, a high efficiency over a wide output voltage range may be therefore achieved by further modulating the resonance slot frequency due to the characteristics of voltage attenuation rate of the multilayer ceramic capacitors, such as the higher output voltage and the smaller capacitance attenuation, see FIG. 6.

Since the conventional technology cannot meet the high capacitance required by the resonant capacitors of the hybrid flyback circuit architecture, the present disclosure may adopt multiple multi-layer ceramic capacitors connected in parallel on a small-sized circuit board, and the small-sized circuit board with the multilayer ceramic capacitors is therefore placed on a main circuit board to save the horizontal space required for a miniaturized adapter product, thereby increasing the overall space utilization rate thereof.

In addition, referring to FIG. 7, the small-sized circuit board with the multilayer ceramic capacitors disclosed in the present disclosure may also be applied to any capacitor circuit with alternating voltage to reduce noise thereof, such as VCC capacitors of the integrated circuits supplied by an auxiliary winding of a transformer, filter capacitors of the Vbus voltage and the output voltage, snubber circuits for the primary side main switch and the secondary side synchronous rectifier switch, etc., but not limited to this.

Accordingly, the circuit board module and electronic device disclosed in the present disclosure may effectively use symmetrically arranged capacitors to attenuate vibrations thereof during operation, and may also use the opening formed in the middle of the circuit board greatly reduces the contact area between the capacitors and the circuit board, and may use air to isolate the noise transmission so as to reduce the noise conducted by solid objects such as the circuit board. In addition, the working efficiency and quality of the circuit board module may further be improved while the larger capacitors are located close to the standing feet and the smaller capacitors are located far away from the standing feet.

Therefore, the circuit board module disclosed in the present disclosure may not only be used for resonant capacitors, but also can be used for any circuit that is used to generate alternating voltage, such as VCC capacitors of integrated circuits, bulk capacitors, output capacitors and snubber circuit capacitors, etc. In addition, the multilayer ceramic capacitors are used as resonant capacitors of the resonant circuit may save the horizontal space required for the cylindrical adapter and improve overall space utilization thereof, as well as the multilayer ceramic capacitors may be utilized to reduce the voltage attenuation rate to achieve a wide output voltage range.

Although the present disclosure has been disclosed above in terms of implementation, it is not intended to limit the present disclosure. Any person with ordinary knowledge in the field may make various variations and modifications without departing from the spirit and scope of the disclosure. Therefore, the spirit and scope of the appended claims should not be limited to the description of the embodiments contained herein.

What is claimed is:

1. A circuit board module, comprising:
a circuit board comprising a plurality of standing feet, wherein the circuit board is vertically erected on a main board by the standing feet of the circuit board; and
a plurality of capacitors symmetrically fixed on a first surface and a second surface opposite to the first surface of the circuit board.

2. The circuit board module of claim 1, wherein an opening is formed on the circuit board and is located between the capacitors.

3. The circuit board module of claim 1, wherein the capacitors comprise a plurality of first capacitors arranged in sequence on the first surface of the circuit board from one end close to the standing feet of the circuit board to another end of the circuit board.

4. The circuit board module of claim 3, wherein the capacitors comprise a plurality of second capacitors arranged in sequence on the second surface of the circuit board from one end close to the standing feet of the circuit board to another end of the circuit board.

5. The circuit board module of claim 4, wherein capacitance values of the first capacitors are the same as capacitance values of the second capacitors.

6. The circuit board module of claim 4, wherein capacitance values of the first capacitors are different and capacitance values of the second capacitors are different.

7. The circuit board module of claim 6, wherein the capacitance values of the first capacitors and the capacitance values of the second capacitors are symmetrically arranged in sequence from the end close to the standing feet of the circuit board to the another end of the circuit board.

8. The circuit board module of claim 7, wherein capacitance values of capacitors, close to the standing feet, of the first capacitors and the second capacitors are greater than capacitance values of capacitors, far away from the standing feet, of the first capacitors and the second capacitors.

9. The circuit board module of claim 8, wherein capacitance values of capacitors of the first capacitors and the second capacitors gradually decrease in sequence from the end close to the standing feet to the another end far away from the standing feet.

10. The circuit board module of claim 1, wherein two indentation portions are formed correspondingly on two side surfaces of the circuit board.

11. An electronic device, comprising:
a casing;
a main board installed in the casing;
a circuit board installed in the casing, wherein the circuit board comprises a plurality of standing feet, wherein the circuit board is vertically erected on the main board by the standing feet of the circuit board; and
a plurality of capacitors symmetrically fixed on a first surface and a second surface opposite to the first surface of the circuit board, wherein the circuit board comprises an opening located between the capacitors, wherein the capacitors comprise a plurality of first capacitors arranged in sequence on the first surface of the circuit board from one end close to the standing feet of the circuit board to another end of the circuit board and the capacitors further comprise a plurality of second capacitors arranged in sequence on the second surface of the circuit board from the one end close to the standing feet of the circuit board to the another end of the circuit board.

12. The electronic device of claim 11, wherein capacitance values of the first capacitors are the same as capacitance values of the second capacitors.

13. The electronic device of claim 11, wherein capacitance values of the first capacitors are different and capacitance values of the second capacitors are different.

14. The electronic device of claim 13, wherein the capacitance values of the first capacitors and the capacitance values of the second capacitors are symmetrically arranged in sequence from the end close to the standing feet of the circuit board to the another end of the circuit board.

15. The electronic device of claim 14, wherein capacitance values of capacitors, close to the standing feet, of the first capacitors and the second capacitors are greater than capacitance values of capacitors, far away from the standing feet, of the first capacitors and the second capacitors.

16. The electronic device of claim 15, wherein capacitance values of capacitors of the first capacitors and the second capacitors gradually decrease in sequence from the end close to the standing feet to the another end far away from the standing feet.

17. The electronic device of claim 11, wherein two indentation portions are formed correspondingly on two side surfaces of the circuit board.

18. An electronic device, comprising:
a main board;
a circuit board, wherein the circuit board comprises a plurality of standing feet, wherein the circuit board is vertically erected on the main board by the standing feet of the circuit board; and a plurality of first capacitors and a plurality of second capacitors symmetrically fixed on a first surface and a second surface opposite to the first surface of the circuit board, wherein the circuit board comprises an opening located between the first capacitors and the second capacitors.

19. The electronic device of claim 18, wherein capacitance values of the first capacitors are the same as capacitance values of the second capacitors.

20. The electronic device of claim 18, wherein the first capacitors and the second capacitors are symmetrically arranged in order according to capacitance values of the first capacitors and the second capacitors.

\* \* \* \* \*